(12) United States Patent
Choi

(10) Patent No.: US 8,575,609 B2
(45) Date of Patent: Nov. 5, 2013

(54) ORGANIC LIGHT EMITTING DISPLAY APPARATUS AND METHOD OF MANUFACTURING THE SAME

(75) Inventor: Jong-Hyun Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 115 days.

(21) Appl. No.: 13/200,826

(22) Filed: Oct. 3, 2011

(65) Prior Publication Data

US 2013/0001562 A1    Jan. 3, 2013

(30) Foreign Application Priority Data

Jun. 28, 2011    (KR) .................. 10-2011-0063048

(51) Int. Cl.
*H01L 29/04*    (2006.01)
(52) U.S. Cl.
USPC ............ 257/59; 257/72; 257/E27.001
(58) Field of Classification Search
USPC ...................... 257/59, 72, E27.001
See application file for complete search history.

(56) References Cited

U.S. PATENT DOCUMENTS 7,893,440 B2    2/2011    Kwon et al.
7,943,937 B2    5/2011    Jung

FOREIGN PATENT DOCUMENTS

KR    10-2000-0039802 A    5/2000
KR    10-2007-0043070 A    4/2007
KR    10-2009-0116131 A    11/2009

*Primary Examiner* — Anthony Ho
(74) *Attorney, Agent, or Firm* — Lee & Morse, P.C.

(57) ABSTRACT

An organic light emitting display apparatus includes a substrate, a thin film transistor formed on the substrate and comprising an active layer, a gate electrode, a source electrode, and a drain electrode, a first gate insulation layer arranged between the gate electrode and the active layer and including an opening portion, a first electrode arranged between the substrate and the first gate insulation layer to overlap the opening portion, an intermediate layer formed on the first electrode and including an organic light emitting layer, a second electrode formed on the intermediate layer, and a capacitor including a first capacitor electrode that is arranged between the substrate and the first gate insulation layer and a second capacitor electrode that is arranged on an upper surface of the first gate insulation layer.

20 Claims, 6 Drawing Sheets

ORGANIC LIGHT EMITTING DISPLAY APPARATUS AND METHOD OF MANUFACTURING THE SAME

CROSS-REFERENCE TO RELATED PATENT APPLICATIONS

This application claims the benefit of Korean Patent Application No. 10-2011-0063048, filed on Jun. 28, 2011, in the Korean Intellectual Property Office, the disclosure of which is incorporated herein in its entirety by reference.

BACKGROUND

1. Field

Embodiments relate to an organic light emitting display apparatus and a method of manufacturing an organic light emitting display apparatus.

2. Description of the Related Art

Recently, display apparatuses have been replaced by portable thin flat display apparatuses. Among the flat display apparatuses, an organic light emitting display apparatus that is a self-light emitting display apparatus exhibits a wide viewing angle, superior contrast, and a fast response speed and thus is highlighted as a next generation display apparatus.

An organic light emitting display apparatus may include an intermediate layer, a first electrode, and a second electrode. The intermediate layer may include an organic light emitting layer. When a voltage is applied to the first and second electrodes, a visible light ray is generated from the organic light emitting layer.

SUMMARY

According to an embodiment, there is provided, an organic light emitting display apparatus including a substrate, a thin film transistor on the substrate, the thin film transistor including an active layer, a gate electrode, a source electrode, and a drain electrode, a first gate insulation layer between the gate electrode and the active layer, the first gate insulation layer including an opening portion, a first electrode between the substrate and the first gate insulation layer, the first electrode overlapping the opening portion, an intermediate layer on the first electrode, the intermediate layer including an organic light emitting layer, a second electrode on the intermediate layer, and a capacitor including a first capacitor electrode between the substrate and the first gate insulation layer and a second capacitor electrode on an upper surface of the first gate insulation layer.

The organic light emitting display apparatus may further include a second gate insulation layer between the first gate insulation layer and the active layer and between the substrate and the first electrode.

The second gate insulation layer may also be between the substrate and the first capacitor electrode.

The first capacitor electrode may be formed of the same material as the first electrode.

The second capacitor electrode may be formed of the same material as the gate electrode.

The first gate insulation layer may further include a via hole that is separated from the opening portion and overlaps the first electrode. One of the source electrode and the drain electrode may be electrically connected to the first electrode in the via hole.

The first electrode may contain a transmissive conductive material.

The transmissive conductive material may include at least one of ITO, IZO, ZnO, $In_2O_3$, IGO, and AZO.

The first electrode may include a transmissive conductive material layer is deposited on a first semi-transmissive metal layer.

The first electrode may further include a second transmissive conductive material layer under the semi-transmissive metal layer.

The semi-transmissive metal layer may contain Ag.

The organic light emitting display apparatus may further include an intermediate layer insulation layer between the gate electrode and the source electrode and between the gate electrode and the drain electrode, and on the first gate insulation layer, the intermediate layer insulation layer including an opening portion, wherein the opening portion of the intermediate layer insulation layer overlaps the first electrode and has a same pattern as the opening portion of the first gate insulation layer.

The intermediate layer may be disposed in the opening portion of the first gate insulation layer, and the opening portion of the first gate insulation layer may be formed to not overlap the thin film transistor.

The organic light emitting display apparatus may further include a protection layer formed on the first electrode not to overlap the opening portion.

The protection layer may contain at least one of Mo, W, Ti, Cu, and Ag.

According to another aspect, a method of manufacturing an organic light emitting display apparatus, which includes forming a thin film transistor including an active layer, a gate electrode, a source electrode, and a drain electrode, on a substrate, forming a first gate insulation layer between the gate electrode and the active layer, the first gate insulation layer including an opening portion, forming a first electrode between the substrate and the first gate insulation layer to overlap the opening portion, forming an intermediate layer comprising an organic light emitting layer, on the first electrode, forming a second electrode on the intermediate layer, and forming a capacitor including a first capacitor electrode that is arranged between the substrate and the first gate insulation layer and a second capacitor electrode that is arranged on an upper surface of the first gate insulation layer.

The first electrode and the first capacitor electrode may be simultaneously formed.

The second capacitor electrode and the gate electrode may be simultaneously formed.

In the forming of the thin film transistor, the forming of the first electrode, and the forming of the capacitor, the first electrode and the first capacitor electrode may be formed after the active layer is formed.

The forming of the thin film transistor, the forming of the first electrode, and the forming of the capacitor may include forming a second gate insulation layer between the active layer and the first gate insulation layer to cover the active layer after the active layer is formed and forming the first electrode and the first capacitor electrode on the second gate insulation layer.

BRIEF DESCRIPTION OF THE DRAWINGS

The above and other features and advantages will become more apparent by describing in detail exemplary embodiments thereof with reference to the attached drawings in which.

DETAILED DESCRIPTION

Figure 1:
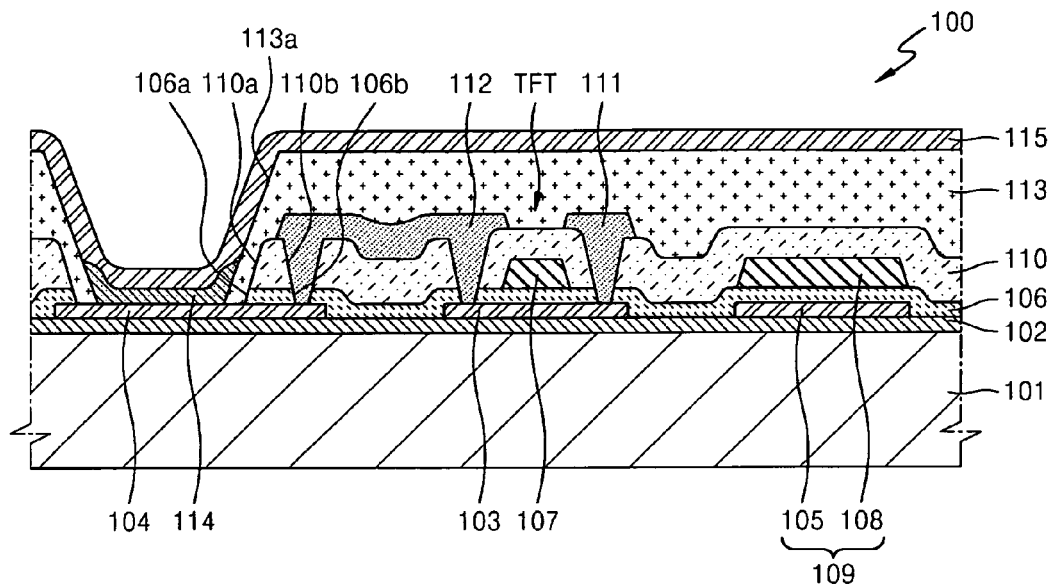
FIG. 1 is a cross-sectional view schematically illustrating an organic light emitting display apparatus according to an embodiment.

The attached drawings for illustrating exemplary embodiments are referred to in order to gain a sufficient understanding of the present embodiments, the merits thereof, and the objectives accomplished thereof. Hereinafter, embodiments will be described in detail by explaining exemplary embodiments of the invention with reference to the attached drawings. Like reference numerals in the drawings denote like elements.

FIG. 1 is a cross-sectional view schematically illustrating an organic light emitting display apparatus 100 according to an embodiment. Referring to FIG. 1, the organic light emitting display apparatus 100 may include a substrate 101, a thin film transistor (TFT), a first electrode 104, an intermediate layer 114, a second electrode 115, a first gate insulation film 106, and a capacitor 109.

The TFT may include an active layer 103, a gate electrode 107, a source electrode 111, and a drain electrode 112. The capacitor 109 may include a first capacitor electrode 105 and a second capacitor electrode 108.

The substrate 101 may be formed of a transparent glass material containing $SiO_2$ as a main ingredient. In another aspect, the substrate 101 may be formed of a transparent plastic material. The plastic material forming the substrate 101 may be at least one selected from a variety of organic substances.

A buffer layer 102 may be formed on the substrate 101. The buffer layer 102 may contain $SiO_2$ or $SiN_x$. The buffer layer 102 may provide a flat surface on an upper portion of the substrate 101 and may prevent intrusion of moisture and foreign materials in a direction toward the substrate 101.

The active layer 103 may be formed on the buffer layer 102. The active layer 103 may contain a semiconductor material and may be formed of, for example, an amorphous silicon or polycrystal silicon material.

The first electrode 104 and the first capacitor electrode 105 may be formed on the buffer layer 102.

The first electrode 104 may contain a transmissive conductive material. In detail, the first electrode 104 may contain at least one material selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

Also, the first electrode 104 may have a multilayer structure, instead of a single layer structure, and may form a transmissive conductive layer on an upper portion of a semitransmissive metal layer formed of silver (Ag). That is, the first electrode 104 may have a deposition structure of ITO/Ag. It may be possible to use IZO, ZnO, $In_2O_3$, IGO, and AZO instead of ITO.

Also, the first electrode 104 may have a triple-layer structure, that is, a deposition structure of ITO/Ag/ITO, and it may be possible to use IZO, ZnO, $In_2O_3$, IGO, and AZO instead of ITO.

The first electrode 104 may include the semi-transmissive metal layer so that a visible light ray generated from the intermediate layer 114 may resonate between the first electrode 104 and the second electrode 115. In another aspect, the first electrode 104 may contain a variety of conductive materials.

The first capacitor electrode 105 may be formed of the same material as the first electrode 104. That is, the first capacitor electrode 105 may contain a transmissive conductive material as in the above-described structure of the first electrode 104 and may be a double-layer structure or a triple-layer structure.

Also, although it is not illustrated, a protection layer (not shown) may be formed on the first electrode 104. In detail, the protection layer may be formed to not overlap an opening portion 106a of the first gate insulation film 106. The protection layer may be formed of a conductive material to contain at least one material selected from a group consisting of Mo, W, Ti, Cu, and Ag. Also, the protection layer may be formed on the upper portion of the first capacitor electrode 105 in the same pattern as the first capacitor electrode 105.

The first gate insulation film 106 may be formed on the active layer 103, the first electrode 104, and the first capacitor electrode 105. The first gate insulation film 106 may include the opening portion 106a and a via hole 106b. The opening portion 106a may be formed to overlap the first electrode 104, thereby exposing a predetermined area of the first electrode 104.

The via hole 106b may be formed to overlap the predetermined area of the first electrode 104 and to be separated from the opening portion 106a.

Also, the opening portion 106a may be formed to not overlap the TFT and the capacitor 109. Accordingly, the visible light ray generated from the intermediate layer 114 formed in the opening portion 106a may proceed toward the substrate 101 without interference by the TFT and the capacitor 109.

The gate electrode 107 and the second capacitor electrode 108 may be formed on the first gate insulation film 106. The gate electrode 107 may be formed of a metal such as Mo, MoW, an Al-based alloy, etc., or a metal alloy. The second capacitor electrode 108 may be formed of the same material as the gate electrode 107.

An intermediate layer insulation layer 110 may be formed to cover the gate electrode 107 and the second capacitor electrode 108. The intermediate layer insulation layer 110 may contain a variety of insulation materials such as an organic material or an inorganic material.

The intermediate layer insulation layer 110 may include an opening portion 110a and a via hole 110b. The opening portion 110a of the intermediate layer insulation layer 110 may overlap the first electrode 104 and may be formed in the same pattern as the opening portion 106a of the first gate insulation film 106. Also, the via hole 110b of the intermediate layer insulation layer 110 may overlap the first electrode 104 and may be separated from the opening portion 110a. Also, the via hole 110b of the intermediate layer insulation layer 110 may be formed in the same pattern as the via hole 106b of the first gate insulation film 106.

The source electrode 111 and the drain electrode 112 may be formed on the intermediate layer insulation layer 110. The source electrode 111 and drain electrode 112 may be connected to the active layer 103.

Also, any one of the source electrode 111 and the drain electrode 112 may be electrically connected to the first electrode 104. FIG. 1 illustrates that the drain electrode 112 is electrically connected to the first electrode 104. In detail, the drain electrode 112 may extend to be lengthy and one end thereof may be electrically connected to the first electrode 104 in the via holes 110b and 106b.

The source electrode 111 and the drain electrode 112 may be formed of a variety of materials, for example, a metal such as Au, Pd, Pt, Ni, Rh, Ru, Ir, Os, Al, Mo, Nd, Mo, W, etc., or an alloy of at least two of the metals.

A pixel define layer 113 may be formed to cover the TFT on the intermediate layer insulation layer 110. The pixel define layer 113 may be formed to expose a predetermined area of an upper surface of the first electrode 104. That is, the pixel define layer 113 may include an opening portion 113a that is formed to overlap the first electrode 104. The opening portion 113a of the pixel define layer 113 may not overlap the TFT and the capacitor 109. Accordingly, visible light rays generated from the intermediate layer 114 formed in the opening portion 113a may proceed toward the substrate 101 without interference by the TFT and the capacitor 109.

The intermediate layer 114 may be formed to contact the first electrode 104. The intermediate layer 114 may include an organic light emitting layer (not shown). In detail, the intermediate layer 114 may be formed in the opening portions 113a, 110a, and 106a and the intermediate layer 114 may include the organic light emitting layer.

The second electrode 115 may be formed on the intermediate layer 114. The second electrode 115 may contain a variety of conductive materials.

As a detailed example, the second electrode 115 may contain a reflective material. Accordingly, visible light rays generated from the intermediate layer 114 may be reflected from the second electrode 115 so that the visible light rays may resonate between the first electrode 104 and the second electrode 115.

That is, the visible light rays generated from the intermediate layer 114 may resonate between the first electrode 104 and the second electrode 115 and then proceed toward the first electrode 104. Accordingly, a light efficiency of the organic light emitting display apparatus 100 may be improved.

When a voltage is applied to the first electrode 104 and the second electrode 115, visible light rays may be generated from the organic light emitting layer of the intermediate layer 114.

A seal member (not shown) may be arranged on the second electrode 115. The seal member may protect the intermediate layer 114 and other layers from external moisture or oxygen. The seal member may be formed of a transparent material. To this end, the seal member may be formed of glass, plastic, an organic material, an inorganic material, a superposed structure of an organic material and an inorganic material, or other various types of materials.

In the organic light emitting display apparatus 100 according to the present embodiment, the first electrode 104 may be formed between the first gate insulation film 106 and the substrate 101. Accordingly, the first electrode 104 may not be formed on the same plane as the gate electrode 107, the source electrode 111, and the drain electrode 112, and contamination and defects of the first electrode 104 that may be generated when the gate electrode 107, the source electrode 111, and the drain electrode 112 are formed may be prevented. Accordingly, an electric characteristic of the first electrode 104 may be improved and thus an image quality characteristic of the organic light emitting display apparatus 100 may be improved.

Also, the first capacitor electrode 105 may not be formed on the same plane as the gate electrode 107, the source electrode 111, and the drain electrode 112, and contamination and defects of the first capacitor electrode 105 that may be generated when the gate electrode 107, the source electrode 111, and the drain electrode 112 are formed may be prevented.

Also, by arranging the first electrode 104 and the first capacitor electrode 105 on the substrate 101, that is, on the same plane as the active layer 103, the overall thickness of the organic light emitting display apparatus 100 may be easily reduced.

Also, the first capacitor electrode 105 of the capacitor 109 may be formed of the same material and on the same plane as the first electrode 104, and the second capacitor electrode 108 may be formed of the same material and on the same plane as the gate electrode 107. Accordingly, the capacitor 109 may be easily formed and the thickness of the organic light emitting display apparatus 100 may not be increased.

Also, since the first electrode 104 may include a semi-transmissive metal layer, visible light rays generated from the intermediate layer 114 may resonate between the first electrode 104 and the second electrode 115 so that a light efficiency of the organic light emitting display apparatus 100 may be improved and the image quality characteristic thereof may be improved.

Also, the protection layer formed on the first electrode 104 may effectively protect the upper surface of the first electrode 104 so that deterioration of the electric characteristic during electric connection between the first electrode 104 and the drain electrode 112 may be prevented. Also, since the protection layer may be arranged on the first capacitor electrode 105, durability of the first capacitor electrode 105 may be improved and the electric capacitance of the capacitor 109 may be increased.

Figure 2:
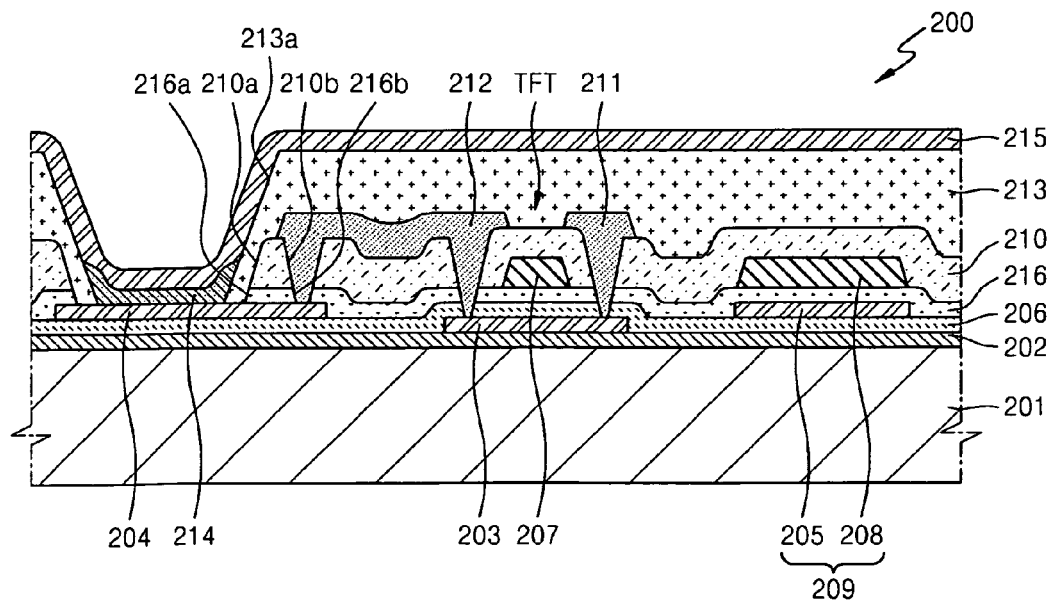
FIG. 2 is a cross-sectional view schematically illustrating an organic light emitting display apparatus according to another embodiment.

FIG. 2 is a cross-sectional view schematically illustrating an organic light emitting display apparatus 200 according to another embodiment. Referring to FIG. 2, the organic light emitting display apparatus 200 includes a substrate 201, a TFT, a first electrode 204, an intermediate layer 214, a second electrode 215, a first gate insulation film 216, a second gate insulation layer 206, and a capacitor 209.

For convenience of explanation, detailed descriptions of the same elements as those in the above-described embodiment will not be repeated herein.

The TFT may include an active layer 203, a gate electrode 207, a source electrode 211, and a drain electrode 212. The capacitor 209 may include a first capacitor electrode 205 and a second capacitor electrode 208.

A buffer layer 202 may be formed on the substrate 201. The active layer 203 may be formed on the buffer layer 202. The second gate insulation layer 206 may be formed on the active layer 203.

The first electrode 204 and the first capacitor electrode 205 may be formed on the second gate insulation layer 206. Since a structure of the first electrode 204 is the same as that of the above-described embodiment, a detailed description thereof will not be repeated herein. Also, as in the above-described embodiment, a protection layer (not shown) may be formed on the first electrode 204 to not overlap an opening portion 216a. The protection layer may be formed on an upper surface of the first capacitor electrode 205.

The first capacitor electrode 205 may be formed of the same material as the first electrode 204.

The first gate insulation film 216 may be formed on the first electrode 204 and the first capacitor electrode 205. The first gate insulation film 216 may include the opening portion 216a and a via hole 216b. The opening portion 216a may be formed to overlap the first electrode 204 to expose a predetermined area of the first electrode 204.

The via hole 216b may overlap the predetermined area of the first electrode 204 and may be separated from the opening portion 216a.

Also, the opening portion 216a may be formed to not overlap the TFT and the capacitor 209. Accordingly, visible light rays generated from the intermediate layer 214 formed in the opening portion 216a may proceed toward the substrate 201 without interference from the TFT and the capacitor 209.

The first gate insulation film 216 may be formed of the same material as the second gate insulation layer 206 or a material different therefrom.

The gate electrode 207 and the second capacitor electrode 208 may be formed on the first gate insulation film 216. The second capacitor electrode 208 may be formed of the same material as the gate electrode 207.

An intermediate layer insulation layer 210 may be formed to cover the gate electrode 207 and the second capacitor electrode 208.

The intermediate layer insulation layer 210 may include an opening portion 210a and a via hole 210b. The opening portion 210a of the intermediate layer insulation layer 210 may overlap the first electrode 204 and may be formed in the same pattern as the opening portion 216a of the first gate insulation film 216. Also, the via hole 210b of the intermediate layer insulation layer 210 may overlap the first electrode 204 and may be separated from the opening portion 210a. Also, the via hole 210b of the intermediate layer insulation layer 210 may be formed in the same pattern as the via hole 216b of the first gate insulation film 216.

The source electrode 211 and the drain electrode 212 may be formed on the intermediate layer insulation layer 210. The source electrode 211 and the drain electrode 212 may be connected to the active layer 203.

Also, any one of the source electrode 211 and the drain electrode 212 may be electrically connected to the first electrode 204. In FIG. 2, the drain electrode 212 is electrically connected to the first electrode 204. In detail, the drain electrode 212 may extend to be lengthy and one end thereof may be electrically connected to the first electrode 204 in the via holes 210b and 216b.

A pixel define layer 213 may be formed on the intermediate layer insulation layer 210 to cover the TFT. The pixel define layer 213 may be formed to expose a predetermined area of an upper surface of the first electrode 204. That is, the pixel define layer 213 includes an opening portion 213a that may be formed to overlap the first electrode 204.

The intermediate layer 214 may be formed to contact the first electrode 204. In detail, the intermediate layer 214 may be formed in the openings 213a, 210a, and 216a, and the intermediate layer 214 may include an organic light emitting layer (not shown).

The second electrode 215 may be formed on the intermediate layer 214. A seal member (not shown) may be arranged on the second electrode 115.

In the organic light emitting display apparatus 200 according to the present embodiment, the first electrode 204 may be formed between the first gate insulation film 216 and the second gate insulation layer 206. Accordingly, the first electrode 204 is not formed on the same plane as the gate electrode 207, the source electrode 211, and the drain electrode 212, and contamination and defects of the electrode 204 that be generated when the gate electrode 207, the source electrode 211, and the drain electrode 212 are formed may be prevented. Accordingly, an electric characteristic of the first electrode 204 may be improved so that an image quality characteristic of the organic light emitting display apparatus 200 may be improved.

Also, in the present embodiment, the second gate insulation layer 206 may be formed on the active layer 203, and the first electrode 204 and the first capacitor electrode 205 may be formed on the second gate insulation layer 206. Accordingly, damage to the active layer 203 that may greatly affect the electric characteristic of the TFT may be easily prevented. In particular, when the first electrode 204 and the first capacitor electrode 205 are formed, damage to the active layer 203 may be prevented. As a result, the electric characteristic of the TFT may be improved so that the above-described image quality improvement effect of the organic light emitting display apparatus 200 may be improved.

Also, the first capacitor electrode 205 is not formed on the same plane as the gate electrode 207, the source electrode 211, and the drain electrode 212, and the contamination and defects of the first capacitor electrode 205 that may be generated when the gate electrode 207, the source electrode 211, and the drain electrode 212 are formed may be prevented.

Also, the first capacitor electrode 205 of the capacitor 209 may be formed of the same material and on the same plane as the first electrode 204, and the second capacitor electrode 208 may be formed of the same material and on the same plane as the gate electrode 207. Accordingly, the capacitor 209 may be formed easily, and the thickness of the organic light emitting display apparatus 200 may be effectively reduced.

Also, the first electrode 204 may include a semi-transmissive metal layer and visible light rays generated from the intermediate layer 214 may resonate between the first electrode 204 and the second electrode 215 so that a light efficiency of the organic light emitting display apparatus 200 may be improved and an image quality characteristic thereof may be improved as well.

FIGS. 3A through 3F are cross-sectional views sequentially illustrating a method of manufacturing an organic light emitting display apparatus according to an embodiment. In detail, FIGS. 3A through 3F illustrate a method of manufacturing the organic light emitting display apparatus 100 of FIG. 1. For convenience of explanation, detailed descriptions of the structure such as a material of each member in the above-described embodiment will not be repeated herein.

Figure 3A:
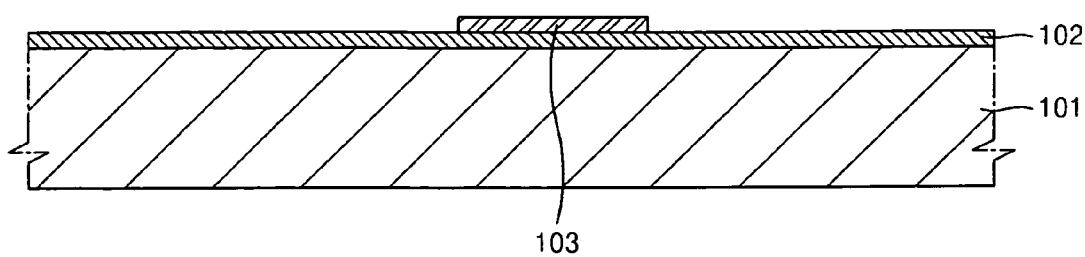
FIGS. 3A through 3F are cross-sectional views sequentially illustrating a method of manufacturing an organic light emitting display apparatus according to an embodiment.

Referring to FIG. 3A, the buffer layer 102 and the active layer 103 may be formed on the substrate 101. In detail, the buffer layer 102 may be formed on the substrate 101, and the active layer 103 may be formed on the buffer layer 102 to have a predetermined pattern.

Figure 3B:
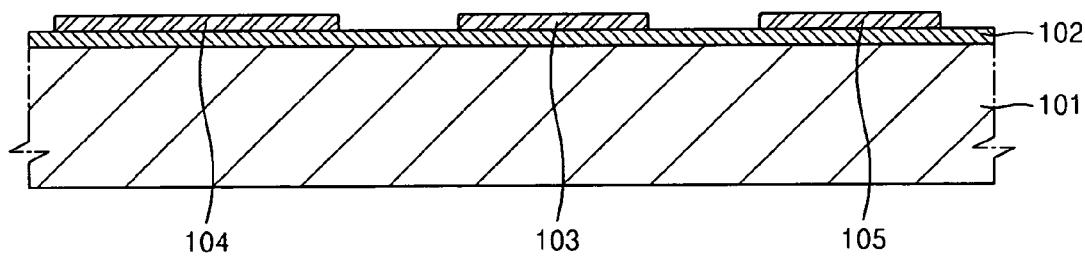

Referring to FIG. 3B, the first electrode 104 and the first capacitor electrode 105 may be formed on the buffer layer 102 to be separated from the active layer 103. The first electrode 104 and first capacitor electrode 105 may be formed of the same material and may be simultaneously patterned using a single mask. Although it is not illustrated in FIG. 3B, as in the embodiment of FIG. 1, the protection layer containing at least one of Mo, W, Ti, Cu, and Ag may be formed on the first electrode 104 and the first capacitor electrode 105. In detail, the protection layer may have the same pattern as the first electrode 104 and the first capacitor electrode 105 using the patterning process of the first electrode 104 and the first capacitor electrode 105.

Since the first electrode 104 and the first capacitor electrode 105 may be formed after the active layer 103 is formed, the first electrode 104 and first capacitor electrode 105 may be fundamentally prevented from being damaged during the patterning process of the active layer 103.

Figure 3C:
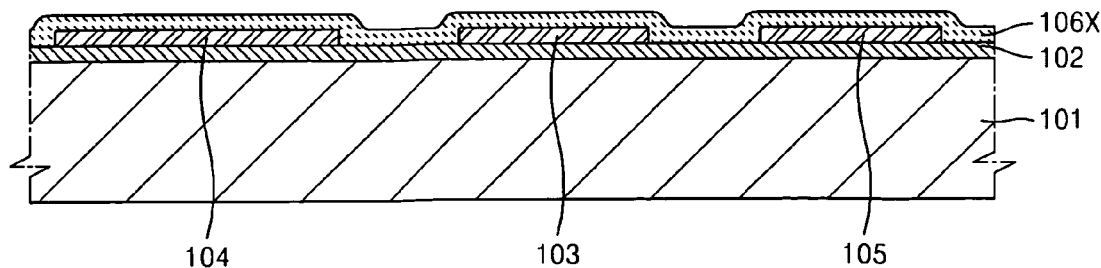

Referring to FIG. 3C, a first insulation layer 106X that is used as a material of a first gate insulation layer 106 may be formed to cover the active layer 103, the first electrode 104, and the first capacitor electrode 105. As illustrated in FIG. 3C, the first insulation layer 106X may be formed without a predetermined pattern.

Figure 3D:
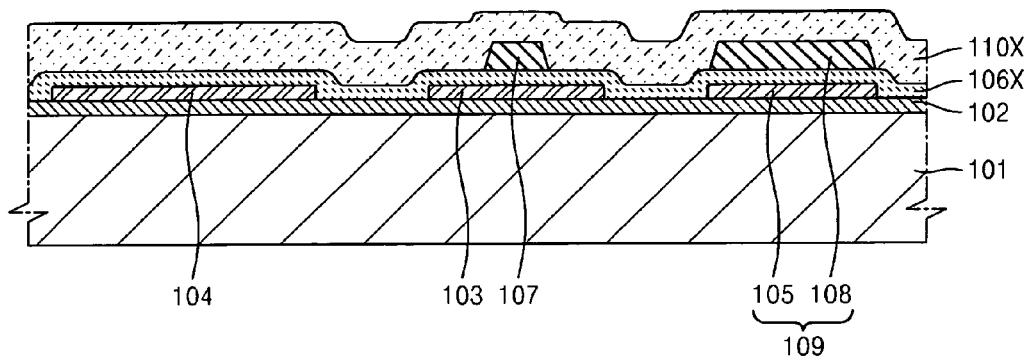

Referring to FIG. 3D, the gate electrode 107, the second capacitor electrode 108, and a second insulation layer 110X may be formed on the first insulation layer 106X.

In detail, the gate electrode 107 and the second capacitor electrode 108 may be formed on the first insulation layer 106X. The gate electrode 107 and the second capacitor electrode 108 may be formed by simultaneously patterning the same material.

The second insulation layer 110X that is used as a material of the intermediate layer insulation layer may be formed to cover the gate electrode 107 and the second capacitor electrode 108. As illustrated in FIG. 3D, the second insulation layer 110X may be formed without a predetermined pattern.

Figure 3E:
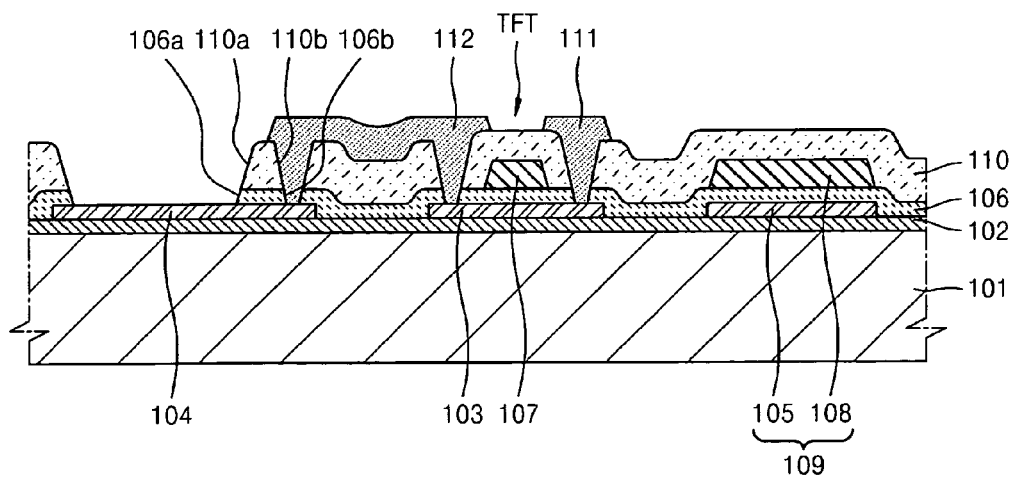

Referring to FIG. 3E, the source electrode 111 and the drain electrode 112 may be formed. Also, the first gate insulation film 106 having the opening portion 106a and the via hole 106b may be formed by patterning the first insulation layer 106X. Also, the intermediate layer insulation layer 110 having the opening portion 110a and the via hole 110b may be formed by patterning the second insulation layer 110X.

The drain electrode 112 may extend to be lengthy and one end thereof may be arranged in the via holes 106b and 110b to contact the first electrode 104.

The opening portion 106a of the first gate insulation film 106 and the opening portion 110a of the intermediate layer insulation layer 110 may be formed to overlap the first electrode 104 and may be parallel to each other. That is, the opening portion 106a of the first gate insulation film 106 and the opening portion 110a of the intermediate layer insulation layer 110 may be simultaneously formed using a single mask. As a result, the opening portion 106a of the first gate insulation film 106 and the opening portion 110a of the intermediate layer insulation layer 110 may have the same pattern.

The via hole 106b of the first gate insulation film 106 and the via hole 110b of the intermediate layer insulation layer 110 may be formed to overlap the first electrode 104 and may be parallel to each other. That is, the via hole 106b of the first gate insulation film 106 and the via hole 110b of the intermediate layer insulation layer 110 may be simultaneously formed using a single mask. As a result, the via hole 106b of the first gate insulation film 106 and the via hole 110b of the intermediate layer insulation layer 110 may have the same pattern.

Also, the opening portions 110a and 106a and the via holes 110b and 106b may be simultaneously formed using a single mask.

Although it is not illustrated, the above-described protection layer may be patterned. In detail, a portion corresponding to the opening portions 110a and 106a among the protection layer above the first electrode 104 may be removed. That is, the protection layer above the first electrode 104 may be formed to not overlap the opening portions 110a and 106a.

Before the source electrode 111 and the drain electrode 112 illustrated in FIG. 3E are formed, a predetermined area of the active layer 103 may be exposed by removing a predetermined area of the first gate insulation film 106 and the intermediate layer insulation layer 110. The exposed surface of the active layer 103 may be cleaned so that a contact characteristic of the active layer 103 and the source electrode 111, and the active layer 103 and the drain electrode 112. The first electrode 104 containing a transmissive conductive material may be easily damaged by a cleaning agent during the cleaning process. In the present embodiment, however, the protection layer may be formed on the first electrode 104 so that the first electrode 104 may be prevented from being damaged during the cleaning process.

Figure 3F:
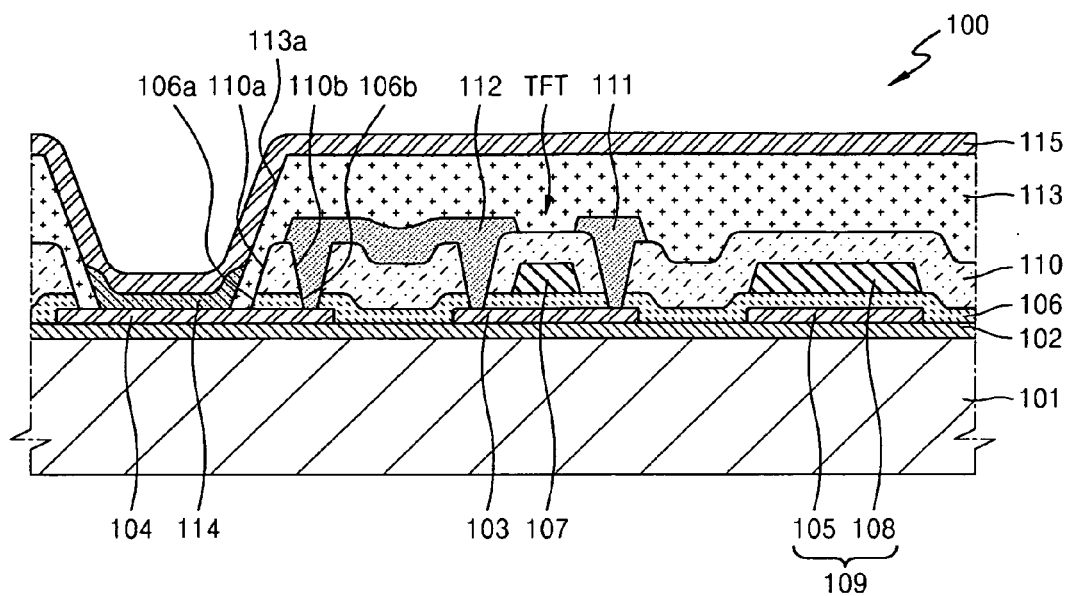

Referring to FIG. 3F, the intermediate layer 114 and the second electrode 115 may be formed, thereby completing the organic light emitting display apparatus 100.

In detail, the pixel define layer 113 may be formed on the intermediate layer insulation layer 110 to cover the TFT. The pixel define layer 113 may include the opening portion 113a to expose a predetermined area of the upper surface of the first electrode 104. The intermediate layer 114 may be connected to the first electrode 104 in the opening portion 113a.

The second electrode 115 may be formed on the intermediate layer 114. The second electrode 115 may be formed on the pixel define layer 113 without a pattern.

When a voltage is applied through the first electrode 104 and the second electrode 115, visible light rays may be generated from the organic light emitting layer of the intermediate layer 114.

The seal member may be arranged on the second electrode 115.

Figure 4A:
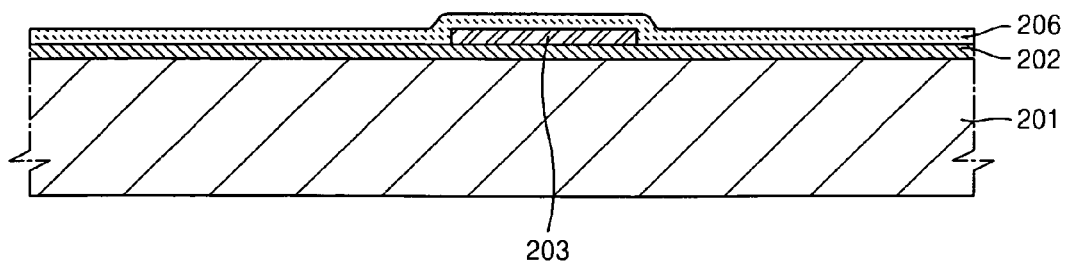
FIGS. 4A through 4F are cross-sectional views sequentially illustrating a method of manufacturing an organic light emitting display apparatus according to another embodiment.
Figure 4B:
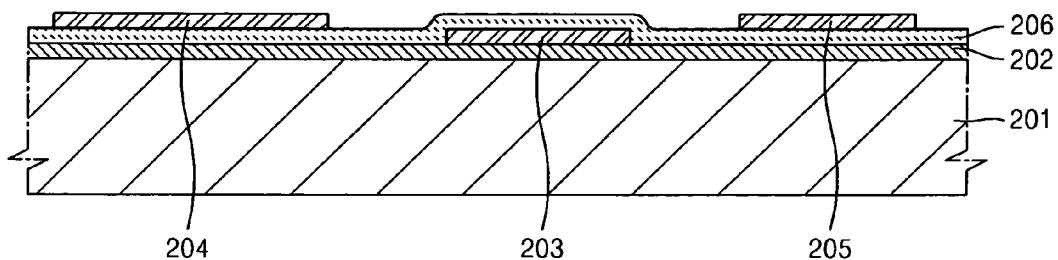

FIGS. 4A through 4F are cross-sectional views sequentially illustrating a method of manufacturing an organic light emitting display apparatus according to another embodiment. In detail, FIGS. 4A and 4B illustrate a method of manufacturing the organic light emitting display apparatus 200 of FIG. 2. For convenience of explanation, detailed descriptions of the elements of the above-described embodiment such as a material will not be repeated herein.

Referring to FIG. 4A, the buffer layer 202, the active layer 203, and the second gate insulation layer 206 may be formed on the substrate 201. In detail, the buffer layer 202 may be formed on the substrate 201, the active layer 203 may be formed on the buffer layer 202 to have a predetermined pattern, and the second gate insulation layer 206 may be formed to cover the active layer 203.

Referring to FIG. 4B, the first electrode 204 and the first capacitor electrode 205 may be formed on the second gate insulation layer 206. The first electrode 204 and the first capacitor electrode 205 may be formed of the same material and simultaneously patterned using a single mask.

Although it is not illustrated in FIG. 4B, as in the above-described embodiment, the protection layer containing any one selected from a group consisting of Mo, W, Ti, Cu, and Ag may be formed on the first electrode 204 and the first capacitor electrode 205. In detail, the protection layer may be formed to have the same pattern as the first electrode 204 and the first capacitor electrode 205 using the patterning process of the first electrode 204 and the first capacitor electrode 205.

Figure 4C:
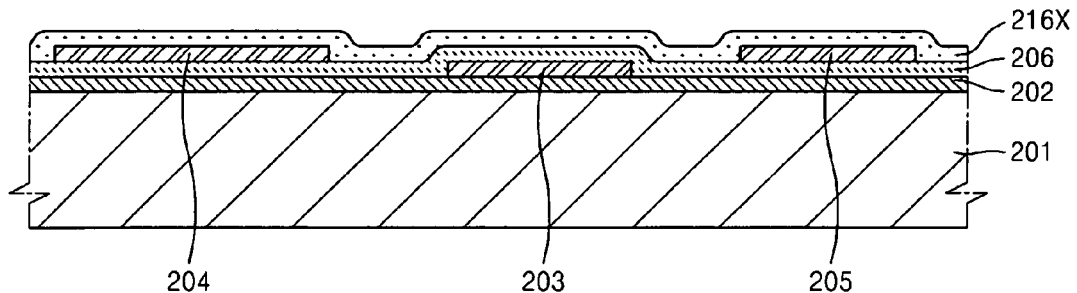

Referring to FIG. 4C, a first insulation layer 216X that is a material used for the first gate insulation layer 216 may be formed to cover the first electrode 204 and first capacitor electrode 205. As illustrated in FIG. 4C, the first insulation layer 216X may be formed without a predetermined pattern.

Figure 4D:
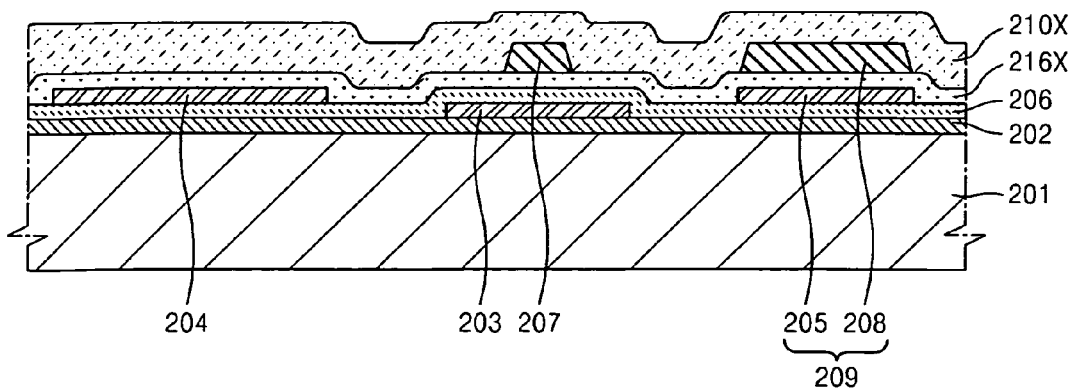

Referring to FIG. 4D, the gate electrode 207, the second capacitor electrode 208, and a second insulation layer 210X may be formed on the first insulation layer 216X.

In detail, the gate electrode 207 and the second capacitor electrode 208 may be formed on the first insulation layer 216X. The gate electrode 207 and the second capacitor electrode 208 may be formed of the same material and simultaneously patterned.

The second insulation layer 210X that is used as a material of the intermediate layer insulation layer may be formed to cover the gate electrode 207 and the second capacitor electrode 208. As illustrated in FIG. 4D, the second insulation layer 210X may be formed without a predetermined pattern.

Figure 4E:
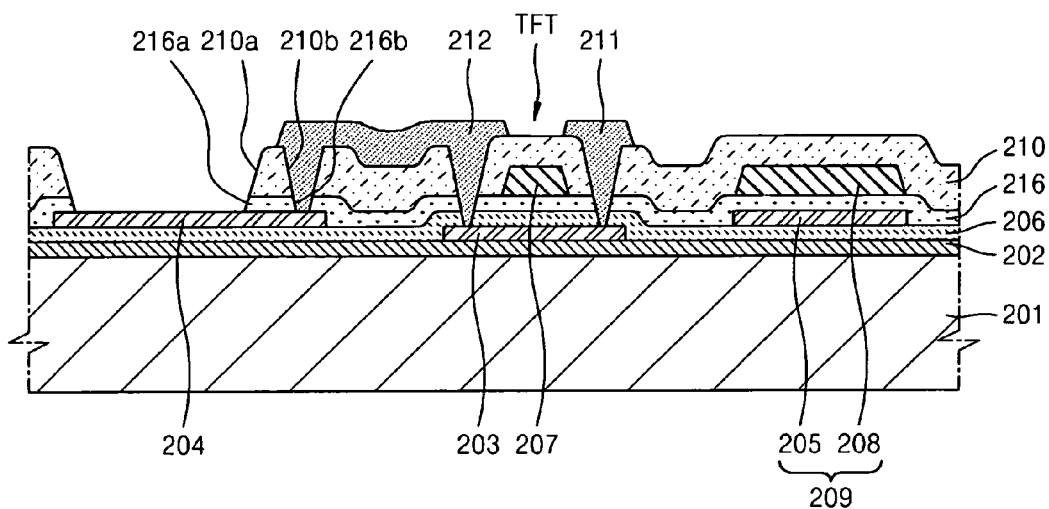

Referring to FIG. 4E, the source electrode 211 and the drain electrode 212 may be formed. Also, the first gate insulation film 216 having the opening portion 216a and the via hole 216b may be formed by patterning the first insulation layer 216X. Also, the intermediate layer insulation layer 210 having the opening portion 210a and the via hole 210b may be formed by patterning the second insulation layer 210X.

The drain electrode 212 may extend to be lengthy and one end thereof may be arranged in the via holes 206b and 210b to contact the first electrode 204.

The opening portion 216a of the first gate insulation film 216 and the opening portion 210a of the intermediate layer insulation layer 210 may be formed to overlap the first electrode 204 and may be parallel to each other. That is, the opening portion 216a of the first gate insulation film 216 and the opening portion 210a of the intermediate layer insulation layer 210 may be simultaneously formed using a single mask. As a result, the opening portion 216a of the first gate insulation film 216 and the opening portion 210a of the intermediate layer insulation layer 210 may have the same pattern.

The via hole 216b of the first gate insulation film 216 and the via hole 210b of the intermediate layer insulation layer 210 may be formed to overlap the first electrode 204 and may be parallel to each other. That is, the via hole 216b of the first gate insulation film 216 and the via hole 210b of the intermediate layer insulation layer 210 may be simultaneously formed using a single mark. As a result, the via hole 216b of the first gate insulation film 216 and the via hole 210b of the intermediate layer insulation layer 210 may have the same pattern.

Also, the opening portions 210a and 216a and the via holes 210b and 216b may be simultaneously formed using a single mask.

Although it is not illustrated, the protection layer may be patterned. In detail, a portion corresponding to the opening portions 210a and 216a among the protection layer above the first electrode 204 may be removed. That is, the protection layer above the first electrode 204 may be formed to not overlap the opening portions 210a and 206a.

Figure 4F:
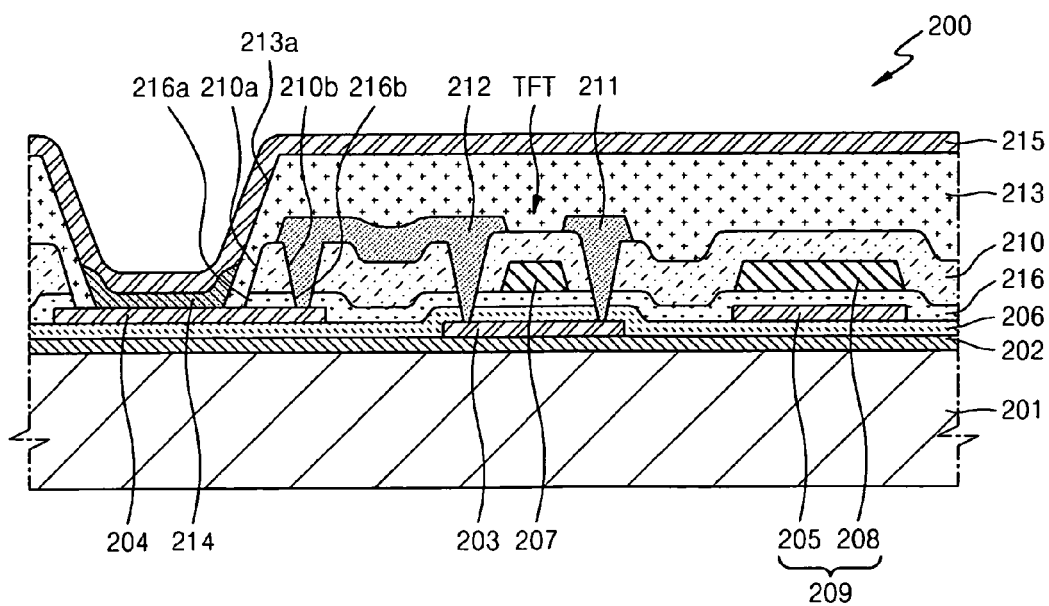

Referring to FIG. 4F, the intermediate layer 214 and the second electrode 215 may be formed, thereby completing the organic light emitting display apparatus 200.

In detail, the pixel define layer 213 may be formed on the intermediate layer insulation layer 210 to cover the TFT. The pixel define layer 213 may include the opening portion 213a to expose a predetermined area of the upper surface of the first electrode 204. The intermediate layer 214 may be connected to the first electrode 204 in the opening portion 213a.

The second electrode 215 may be formed on the intermediate layer 214. The second electrode 215 may be formed on the pixel define layer 213 without a pattern.

When a voltage is applied through the first electrode 204 and the second electrode 215, visible light may be generated from the organic light emitting layer of the intermediate layer 214.

The seal member may be arranged on the second electrode 215.

By way of summation and review, a typical organic light emitting display apparatus includes at least one capacitor for electric driving thereof. Since processes of forming the first electrode and electrodes of a capacitor are difficult, electrical and physical characteristics of the first electrode and the capacitor may be deteriorated so that there may be a limit in the improvement of the image quality characteristic of the organic light emitting display apparatus. Embodiments described herein may provide an organic light emitting display apparatus and a method of manufacturing an organic light emitting display apparatus such that an image quality characteristic may be easily improved.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An organic light emitting display apparatus comprising:
   a substrate;
   a thin film transistor on the substrate, the thin film transistor including an active layer, a gate electrode, a source electrode, and a drain electrode;
   a first gate insulation layer between the gate electrode and the active layer, the first gate insulation layer including an opening portion;
   a first electrode between the substrate and the first gate insulation layer, the first electrode overlapping the opening portion;
   an intermediate layer on the first electrode, the intermediate layer including an organic light emitting layer;
   a second electrode on the intermediate layer; and
   a capacitor including a first capacitor electrode between the substrate and the first gate insulation layer and a second capacitor electrode on an upper surface of the first gate insulation layer.

2. The organic light emitting display apparatus of claim 1, further comprising a second gate insulation layer between the first gate insulation layer and the active layer and between the substrate and the first electrode.

3. The organic light emitting display apparatus of claim 2, wherein the second gate insulation layer is also between the substrate and the first capacitor electrode.

4. The organic light emitting display apparatus of claim 1, wherein the first capacitor electrode is formed of a same material as the first electrode.

5. The organic light emitting display apparatus of claim 1, wherein the second capacitor electrode is formed of a same material as the gate electrode.

6. The organic light emitting display apparatus of claim 1, wherein:
   the first gate insulation layer further includes a via hole that is separated from the opening portion and overlaps the first electrode, and
   one of the source electrode and the drain electrode is electrically connected to the first electrode in the via hole.

7. The organic light emitting display apparatus of claim 1, wherein the first electrode contains a transmissive conductive material.

8. The organic light emitting display apparatus of claim 7, wherein the transmissive conductive material includes at least one of ITO, IZO, ZnO, $In_2O_3$, IGO, and AZO.

9. The organic light emitting display apparatus of claim 1, wherein the first electrode includes a first transmissive conductive material layer deposited on a semi-transmissive metal layer.

10. The organic light emitting display apparatus of claim 9, wherein the first electrode further includes a second transmissive conductive material layer under the semi-transmissive metal layer.

11. The organic light emitting display apparatus of claim 9, wherein the semi-transmissive metal layer contains Ag.

12. The organic light emitting display apparatus of claim 1, further comprising an intermediate layer insulation layer between the gate electrode and the source electrode and between the gate electrode and the drain electrode, and on the first gate insulation layer, the intermediate layer insulation layer including an opening portion,
- wherein the opening portion of the intermediate layer insulation layer overlaps the first electrode and has a same pattern as the opening portion of the first gate insulation layer.

13. The organic light emitting display apparatus of claim 1, wherein:
- the intermediate layer is disposed in the opening portion of the first gate insulation layer, and
- the opening portion of the first gate insulation layer does not overlap the thin film transistor.

14. The organic light emitting display apparatus of claim 1, further comprising a protection layer on the first electrode, wherein the protection layer does not the opening portion.

15. The organic light emitting display apparatus of claim 14, wherein the protection layer contains at least one of Mo, W, Ti, Cu, and Ag.

16. A method of manufacturing an organic light emitting display apparatus, the method comprising:
- forming a thin film transistor including an active layer, a gate electrode, a source electrode, and a drain electrode, on a substrate;
- forming a first gate insulation layer between the gate electrode and the active layer, the first gate insulation layer including an opening portion;
- forming a first electrode between the substrate and the first gate insulation layer to overlap the opening portion;
- forming an intermediate layer including an organic light emitting layer on the first electrode;
- forming a second electrode on the intermediate layer; and
- forming a capacitor including a first capacitor electrode that is arranged between the substrate and the first gate insulation layer and a second capacitor electrode that is arranged on an upper surface of the first gate insulation layer.

17. The method of claim 16, wherein the first electrode and the first capacitor electrode are simultaneously formed.

18. The method of claim 16, wherein the second capacitor electrode and the gate electrode are simultaneously formed.

19. The method of claim 16, wherein, in the forming of the thin film transistor, the forming of the first electrode, and the forming of the capacitor, the first electrode and the first capacitor electrode are formed after the active layer is formed.

20. The method of claim 16, wherein the forming of the thin film transistor, the forming of the first electrode, and the forming of the capacitor include forming a second gate insulation layer between the active layer and the first gate insulation layer to cover the active layer after the active layer is formed and forming the first electrode and the first capacitor electrode on the second gate insulation layer.

* * * * *